(12) United States Patent
Hudyma

(10) Patent No.: US 7,237,915 B2
(45) Date of Patent: Jul. 3, 2007

(54) CATADIOPTRIC PROJECTION SYSTEM FOR 157 NM LITHOGRAPHY

(75) Inventor: Russell Hudyma, San Ramon, CA (US)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/771,986

(22) Filed: Feb. 3, 2004

(65) Prior Publication Data

US 2004/0160666 A1 Aug. 19, 2004

Related U.S. Application Data

(63) Continuation of application No. 10/444,897, filed on May 23, 2003, now abandoned, which is a continuation of application No. PCT/EP01/13851, filed on Nov. 28, 2001, and a continuation-in-part of application No. 09/761,562, filed on Jan. 16, 2001, now Pat. No. 6,636,350.

(60) Provisional application No. 60/250,996, filed on Dec. 4, 2000, provisional application No. 60/253,508, filed on Nov. 28, 2000, provisional application No. 60/176,190, filed on Jan. 14, 2000.

(51) Int. Cl.
 *G02B 5/08* (2006.01)
(52) U.S. Cl. ...................... 359/861; 359/364; 359/730; 359/857
(58) Field of Classification Search ................ 359/359, 359/364, 365, 726, 850, 727, 730, 733, 857–861
See application file for complete search history.

(56) References Cited

U.S. PATENT DOCUMENTS

| | | |
|---|---|---|
| 3,762,801 A | 10/1973 | Baker |
| 4,171,871 A | 10/1979 | Dill et al. |
| 4,232,969 A | 11/1980 | Wilczynski |
| 4,595,295 A | 6/1986 | Wilczynski |
| 4,685,777 A | 8/1987 | Hirose |
| 4,701,035 A | 10/1987 | Hirose |
| 4,757,354 A | 7/1988 | Sato et al. |
| 4,812,028 A | 3/1989 | Matsumoto et al. |

(Continued)

FOREIGN PATENT DOCUMENTS

DE 197 26 058 1/1998

(Continued)

OTHER PUBLICATIONS

Morgan, Joseph, Introduction to Geometrical and Physical Optics, McGraw-Hill, 1953, p. 2.

(Continued)

*Primary Examiner*—Stephone B. Allen
*Assistant Examiner*—Joshua L. Pritchett
(74) *Attorney, Agent, or Firm*—Darby & Darby

(57) ABSTRACT

A photolithographic reduction projection catadioptric objective includes a first optical group G1 including an even number of at least four mirrors M1–M6; and a second at least substantially dioptric optical group G2 imageward than the first optical group G1 including a number of lenses E4–E13. The first optical group G1 provides compensative axial aberrative correction for the second optical group G2 which forms an image with a numerical aperture of at least substantially 0.65, and preferably at least 0.70 or 0.75. Six mirror examples are shown.

29 Claims, 2 Drawing Sheets

U.S. PATENT DOCUMENTS

| | | | |
|---|---|---|---|
| 5,052,763 A | 10/1991 | Singh et al. | |
| 5,063,586 A | 11/1991 | Jewell et al. | |
| 5,071,240 A | 12/1991 | Ichihara et al. | |
| 5,078,502 A | 1/1992 | Cook | |
| 5,089,913 A | 2/1992 | Singh et al. | |
| 5,153,898 A | 10/1992 | Suzuki et al. | |
| 5,159,172 A | 10/1992 | Goodman et al. | |
| 5,212,588 A | 5/1993 | Viswanathan et al. | |
| 5,220,590 A | 6/1993 | Bruning et al. | |
| 5,241,423 A | 8/1993 | Chiu et al. | |
| 5,315,629 A | 5/1994 | Jewell et al. | |
| 5,323,263 A | 6/1994 | Schoenmakers | |
| 5,353,322 A | 10/1994 | Bruning et al. | |
| 5,401,934 A | 3/1995 | Ainsworth, Jr. et al. | |
| 5,410,434 A | 4/1995 | Shafer | |
| 5,515,207 A * | 5/1996 | Foo | 359/731 |
| 5,537,260 A | 7/1996 | Williamson | |
| 5,575,207 A | 11/1996 | Shimizu | |
| 5,592,329 A | 1/1997 | Ishiyama et al. | |
| 5,608,526 A | 3/1997 | Piwonka-Corle et al. | |
| 5,650,877 A | 7/1997 | Phillips et al. | |
| 5,652,679 A | 7/1997 | Freeman | |
| 5,684,636 A | 11/1997 | Chow et al. | |
| 5,686,728 A | 11/1997 | Shafer | |
| 5,694,241 A | 12/1997 | Ishiyama et al. | |
| 5,742,436 A | 4/1998 | Furter | |
| 5,805,357 A | 9/1998 | Omura | |
| 5,805,365 A | 9/1998 | Sweatt | |
| 5,815,310 A | 9/1998 | Williamson | |
| 5,835,275 A | 11/1998 | Takahashi et al. | |
| 5,940,222 A | 8/1999 | Sinclair et al. | |
| 5,956,192 A | 9/1999 | Williamson | |
| 6,008,885 A | 12/1999 | Takashi et al. | |
| 6,014,252 A | 1/2000 | Shafer | |
| 6,033,079 A | 3/2000 | Hudyma | |
| 6,084,724 A | 7/2000 | Wiegand et al. | |
| 6,142,641 A | 11/2000 | Cohen et al. | |
| 6,169,627 B1 | 1/2001 | Schuster | |
| 6,172,825 B1 * | 1/2001 | Takahashi | 359/859 |
| 6,185,049 B1 | 2/2001 | Terada et al. | |
| 6,255,661 B1 * | 7/2001 | Braat | 250/492.2 |
| 6,636,350 B2 | 10/2003 | Shafer et al. | |
| 2001/0043391 A1 * | 11/2001 | Shafer et al. | 359/365 |

FOREIGN PATENT DOCUMENTS

| | | |
|---|---|---|
| DE | 196 39 586 | 4/1998 |
| EP | 0 779 528 | 6/1997 |
| EP | 0 604 093 | 11/1997 |
| EP | 0 869 383 | 10/1998 |
| EP | 0 816892 | 6/1999 |
| EP | 1 069 448 | 7/2000 |
| EP | 1 067 448 | 1/2001 |
| EP | 1 336 887 | 8/2003 |
| WO | WO-94/06047 | 3/1994 |

OTHER PUBLICATIONS

Smith, Warren J. Modern Optical Engineering: the Design of Optical Systems, 3rd Ed, McGraw-Hill, 2000, p. 98.

* cited by examiner

CATADIOPTRIC PROJECTION SYSTEM FOR 157 NM LITHOGRAPHY

RELATED APPLICATIONS

This application is a continuation of U.S. patent application Ser. No. 10/444,897, filed May 23, 2003 now abandoned, which is (1) a continuation of International Application Ser. No. PCT/EP01/13851, filed Nov. 28, 2001 and published in English on Jun. 6, 2002, which claims priority from U.S. Provisional Patent Application Ser. No. 60/253,508, filed Nov. 28, 2000 and from U.S. Provisional Patent Application Ser. No. 60/250,996, filed Dec. 4, 2000, and (2) a Continuation-in-Part of U.S. patent application Ser. No. 09/761,562, filed Jan. 16, 2001 (now U.S. Pat. No. 6,636,350) which claims the benefit of priority to U.S. provisional patent application Ser. No. 60/176,190, filed Jan. 14, 2000, all of the aforementioned patent applications and patents are hereby incorporated by reference in their entirety.

BACKGROUND OF THE INVENTION

1. Field of the Invention

The invention relates to projection systems for photolithography, and particularly to catadioptric systems including first and second optical imaging groups for 157 nm lithography.

2. Discussion of the Related Art

Extending DUV lithography to sub 100-nm linewidths requires a projection system with a high numerical aperture, e.g., 0.65–0.75 or larger, at a wavelength of 157 nm. As optical lithography is extended into the vacuum ultraviolet (VUV), issues surrounding the laser linewidth and material availability could cause substantive delays to the development of a commercial 157 nm step/repeat or step/scan tool. Therefore, it is desired to investigate optical configurations that minimize the consumption of calcium fluoride.

Microlithographic reduction projection catadioptric objectives, such as that shown and described with respect to FIG. 3 of European patent application no. EP 0 779 528 A2, which is hereby incorporated by reference, may be understood as variants of pure catoptric objectives. FIG. 3 of the '528 application shows a system having six minors and three lenses. The optical surfaces are generally symmetric to a common axis, and the object plane and the image plane are situated on this same axis upstream and downstream of the objective, respectively. As described in the '528 application, the system of FIG. 2 therein has a numerical aperture of only 0.55 and that of FIG. 3 therein only 0.6. In addition, all but one of the six mirrors shown at FIG. 3 are cut off sections of a bodies of revolution, yielding mounting and adjustment face difficulties. Also, the lenses shown in FIG. 3 serve only as correcting elements having minor effect. In addition, the most imageward (or optically closest to the image plane) mirror described in the '528 application is concave. It is desired to have an objective with a higher numerical aperture, and which is constructed for easier mounting and adjustment.

A similar objective to that described in the '528 application (above) is disclosed at U.S. Pat. No. 4,701,035, which is hereby incorporated by reference. The objective shown at FIG. 12 of the '035 patent, for example, has nine mirrors, two lenses and two intermediate images. The object plane and image plane are situated within the envelope of the objective. The objective described in the '035 application also exhibits a low numerical aperture and offers similar mounting and adjustment difficulties as described above with respect to the '528 application. In both the '528 and '035 applications, the image field is an off-axis ring sector.

An axially symmetric type of catadioptric objective is disclosed in German patent document DE 196 39 586 A (see also U.S. patent application Ser. No. 09/263,788), each application of which is hereby incorporated by reference. The '586 application discloses an objective having two opposing concave mirrors, an image field centered at the common axis and a central obscuration of the aperture. It is recognized herein that it is desired to have an axially symmetric objective having an unobscured aperture. Another type of catadioptric objective for microlithographic reduction projection has only one concave mirror and a folding mirror, as is described at U.S. Pat. No. 5,052,763 and European patent application no. EP 0 869 383 A, which are each hereby incorporated by reference.

It is recognized herein that catadioptric optical systems have several advantages, especially in a step and scan configuration, and that it is desired to develop such systems for wavelengths below 365 nm. One catadioptric system concept relates to a Dyson-type arrangement used in conjunction with a beam splitter to provide ray clearance and unfold the system to provide for parallel scanning (see, e.g., U.S. Pat. Nos. 5,537,260, 5,742,436 and 5,805,357, which are incorporated by reference). However, these systems have a serious drawback since the size of this beam splitting element becomes quite large as the numerical aperture is increased up to and beyond 0.65 to 0.70, making the procurement of bulk optical material with sufficient quality (in three-dimensions) a high risk endeavor. This problem is exacerbated as wavelengths are driven below 193 nm because the selection of material that can be manufactured to lithographic quality is severely limited.

To circumvent this problem, it is recognized herein that it is desired to develop systems without beamsplitters. However, it is difficult to achieve an adequately high numerical aperture (e.g., U.S. Pat. Nos. 4,685,777, 5,323,263, 5,515,207 and 5,815,310, which are incorporated by reference), or to achieve a fully coaxial configuration, instead of relying on the use of folding mirrors to achieve parallel scanning (e.g., U.S. Pat. No. 5,835,275 and EP 0 816 892, which are incorporated by reference) and thereby complicating the alignment and structural dynamics of the system. In addition, it is desired to have an optical design that generally does not utilize too many lens elements, which can greatly increase the mass of the optical system.

WO 01/51979 A (U.S. Ser. Nos. 60/176,190 and 09/761,562) and WO 01/55767 A (U.S. Ser. Nos. 60/176,190 and 09/759,806)—all commonly owned and published after the priority date of this application—show similar coaxial catadioptric objectives with 4 mirrors or more.

EP 1 069 448 A1 published after the priority date of this application shows a coaxial catadioptric objective with two curved mirrors and a real intermediate image located besides the primary mirror.

All cited publications are incorporated herein by reference in their entirety. It is desired to develop a compact, coaxial, catadioptric projection system for deep ultraviolet and/or vacuum ultraviolet lithography that uses no beamsplitters or fold mirrors in is optical path.

It is an object of the invention to provide an objective for microlithographic projection reduction having high chromatic correction of typical bandwidths of excimer laser light sources, which permits a high image-side numerical aperture, and which reduces complexity with respect to mounting and adjusting.

SUMMARY OF THE INVENTION

In view of the above, a photolithography reduction projection catadioptric objective is provided including a first optical group including an even number of at least four mirrors, and a second at least substantially dioptric optical group more imageward than the first optical group including a number of lenses for providing image reduction. The first optical group provides compensative axial colour correction for the second optical group according to claim 1. Other variations and preferred embodiments are subject of claims 2 to 26.

A preferred embodiment according to claim 11 is a photolithographic reduction projection catadioptric objective including a first optical group including an even number of at least six mirrors, and a second at least substantially dioptric optical group more imageward than the first optical group including a number of lenses for providing image reduction. This increased number of mirrors gives more degrees of freedom to the correction and simplifies the design for stressed qualities.

INCORPORATION BY REFERENCE

Figure 1:
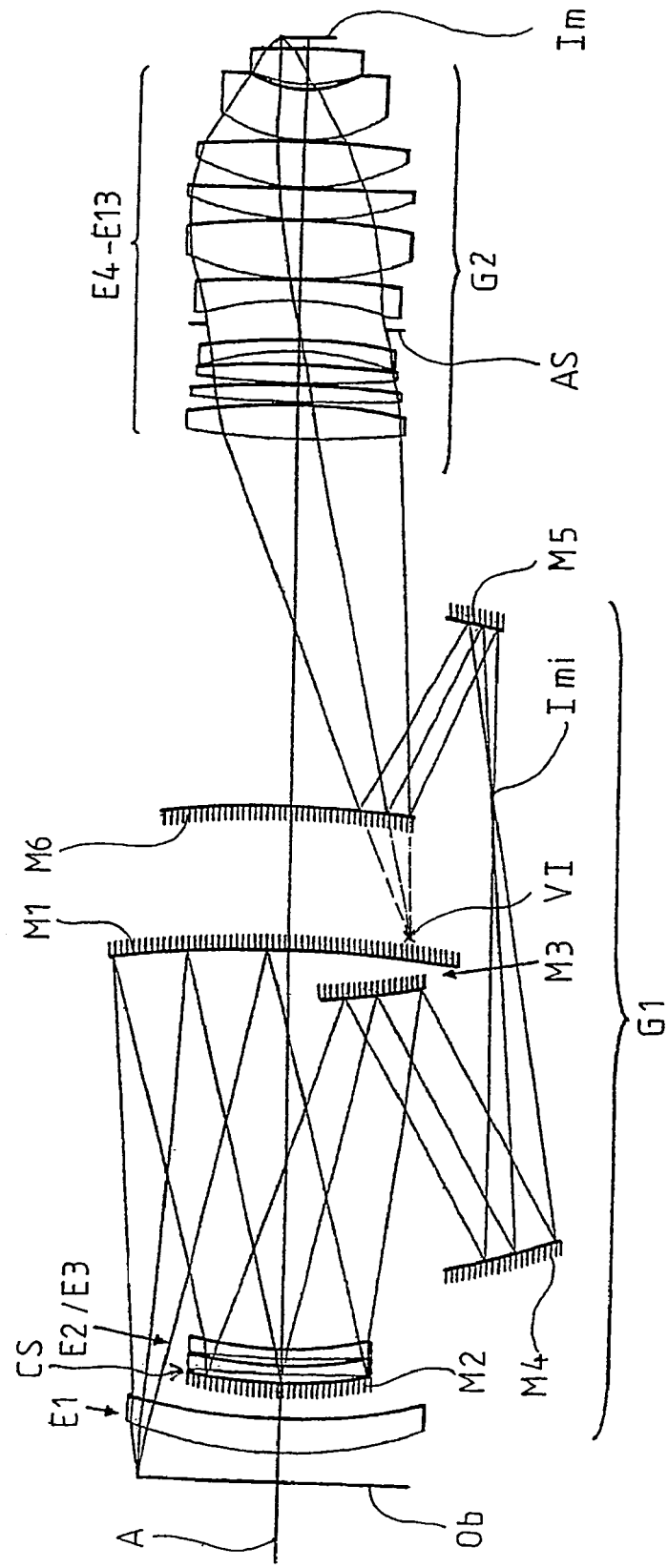
FIG. 1 shows the lens section of a projection objective for 157 nm photolithography according to a first preferred embodiment.
Figure 2:
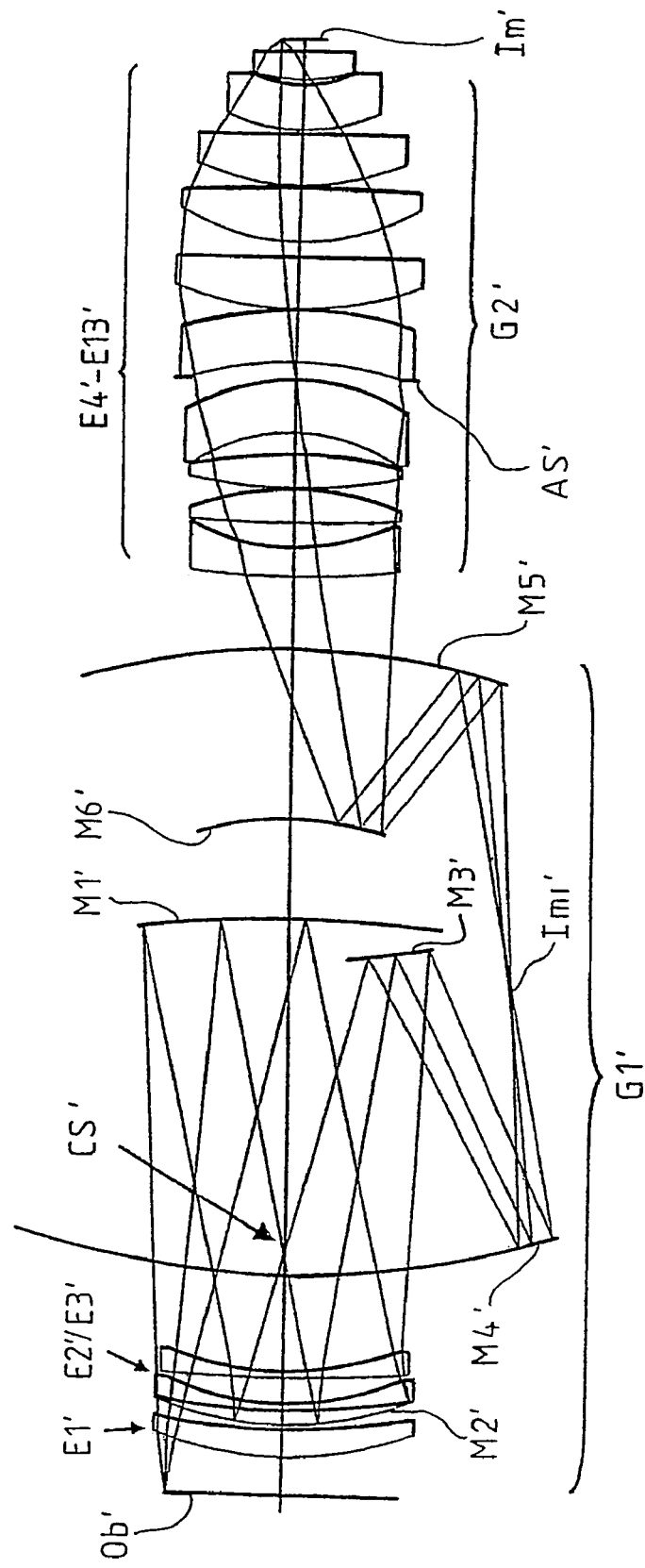
FIG. 2 shows the lens section of a second preferred embodiment.

What follows is a cite list of references which are, in addition to the references cited above in the background section, hereby incorporated by reference into the detailed description of the preferred embodiment, as disclosing alternative embodiments of elements or features of the preferred embodiment not otherwise set forth in detail herein with reference to FIG. 1 or FIG. 2. A single one or a combination of two or more of these references may be consulted to obtain a variation of the preferred embodiment described above. Further patent, patent application and non-patent references, and discussion thereof, cited in the background and/or elsewhere herein are also incorporated by reference into the detailed description of the preferred embodiment with the same effect as just described with respect to the following references:

U.S. Pat. Nos. 5,323,263, 5,515,207, 5,052,763, 5,537,260, 4,685,777, 5,071,240, 5,815,310, 5,401,934, 4,595,295, 4,232,969, 5,742,436, 5,805,357, 5,835,275, 4,171,871, 5,241,423, 5,089,913, 5,159,172, 5,608,526, 5,212,588, 5,686,728, 5,220,590, 5,153,898, 5,353,322, 5,315,629, 5,063,586, 5,410,434, 5,956,192, 5,071,240, 5,078,502, 6,014,252, 5,805,365, 6,033,079, 4,701,035 and 6,142,641; and German patent no. DE 196 39 586 A; and U.S. patent applications Ser. No. 09/263,788 and 09/761,562; and European patent applications no. EP 0 816 892 A1, EP 0 779 528 A2 and EP 0 869 383 A; and "Design of Reflective Relay for Soft X-Ray Lithography", J. M. Rodgers, T. E. Jewell, International Lens Design Conference, 1990;

"Optical System Design Issues in Development of Projection Camera for EUV Lithography", T. E. Jewell, SPIE Volume 2437, pages 340–347;

"Ring-Field EUVL Camera with Large Etendu", W. C. Sweatt, OSA TOPS on Extreme Ultraviolet Lithography, 1996;

"Phase Shifting Diffraction Interferometry for Measuring Extreme Ultraviolet Optics", G. E. Sornargren, OSA TOPS on Extreme Ultraviolet Lithography, 1996; and "EUV Optical Design for a 100 nm CD Imaging System", D. W. Sweeney, R Hudyma, H. N. Chapman, and D. Shafer, SPIE Volume 3331, pages 2–10

DETAILED DESCRIPTION OF THE PREFERRED EMBODIMENTS

A catadioptric projection system according to a preferred embodiment herein is schematically shown at FIG. 1 and includes two distinct optical groups G1 and G2. Group G1 is a catadioptric group including mirrors M1–M6 and lenses E1–E3, as shown in FIG. 1. An object or mask plane Ob is disposed to the left of group G1 in FIG. 1 or optically before group G1. Group G2 is disposed optically after group G1 and to the right of group G1 in FIG. 1. An image or wafer plane Im is disposed optically after group G2 and to the right of group G2 in FIG. 1.

Group G1 functions by correcting field aberrations and providing a conjugate stop position for correction of axial chromatic aberration. Group G2 is a dioptric group including lens elements E4–E13, as also shown in FIG. 1. Group G2 lies aft of G1, or optically nearer the image plane of the system, enabling the system to achieve numerical apertures in excess of 0.65, 0.70 and even 0.75. This catadioptric system achieves a high numerical aperture preferably using no beamsplitters nor fold mirrors. The description herein examines the performance of the preferred system of FIG. 1.

As mentioned, the system of FIG. 1 is separated into two optical groups, i.e., group G1 including 6 mirrors and 3 lens elements and group G2 including 10 individual lens elements. The design is purely coaxial with a single common centerline (axis of symmetry) using an off-axis field to achieve the necessary ray clearance so that the mask and wafer planes are parallel, Group G1 forms a virtual image VI located behind mirror M6 at a reduction of ~0.8×. Group G2 takes this virtual image and forms a usable real image at the wafer. Group G2 takes this virtual image and forms a usable real image at the wafer. Group G2 operates at a reduction of about 0.25×, allowing the system to achieve a desired reduction of 0.20×. A complete optical prescription is found in Table 2, below, describing the optical surfaces in Code V format.

Referring to FIG. 1, how the preferred design achieves the performance listed in Table 1 is now explained. To correct chromatic aberration, the aperture stop AS that lies in group G2 has a conjugate position located within group G1 preferably at, and alternatively near, mirror M2. At M2, strong negative lenses E2/B3 are used in a double-pass configuration for inducing overcorrected (positive) axial chromatic aberration used to balance or correct an undercorrected (negative) axial chromatic aberration created by the strong positive optical power of group G2. With regard to lateral chromatic aberration, FIG. 1 shows an aperture stop AS in group G2 placed in a quasi-symmetric manner, allowing the Lateral chromatic aberration to be at least nearly self-corrected within group G2 itself. In practice, lateral chromatic aberration of a few parts per million (ppm) may be within tolerance within group G2 and can be corrected using slight asymmetry of the chief ray near the conjugate stop position at mirror M2.

By balancing aberration correction between G1 and G2, the monochromatic aberrations are corrected in such a way to leave the lens elements within G2 "unstressed." The term "unstressed" is used to signify the fact that no steep ray bendings are used within G2 to promote high-order aberration correction. Both the chief and marginal rays exhibit this behavior. The fact that group G2 is "unstressed" is advantageous when manufacturing and assembly tolerances are considered in detail.

Overall, the system of FIG. 1 includes 6 mirrors and 13 lens elements in a coaxial configuration all coaxial to axis A. The design utilizes an off-axis field to enable ray clearance and allow the mask and wafer planes to be parallel. Lens element E1 of group G1 is used to make the chief ray telecentric at the mask plane. Group G1 forms a virtual image behind mirror M6, which is relayed by the dioptric group G2 to form a final image at the wafer plane.

TABLE 1

System of FIG. 1 Performance Summary

| Parameter | Performance |
|---|---|
| Wavelength (nm) | 157 |
| Spectral band (pm) | 0.5 |
| Reduction ratio (R) | 0.20 |
| Field size (mm) | 22 × 7 rectangular |
| Numerical aperture(NA) | 0.75 |
| RMS wavefront error (waves) | 0.013 λ |
| Distortion (nm) | <1 nm |
| PAC (ppm) | 39.0 ppm |
| PLC (ppm) | 0.0 ppm |
| Total track (mm) distance Ob–Im | 1250 |
| Front working distance (mm) | 25.0 |
| Back working distance (mm) | 10.0 |
| Blank mass (kg, estimated) | 39.0 |

Table 1 shows that the monochromatic RMS wavefront error, distortion, and chromatic aberrations PAC—paraxial axial colour aberration and PLC—paraxial local colour aberration are reduced small residual values as desired for precision lithographic projection systems. Further, the system of FIG. 1 may be confined within a volume that is similar to or smaller than conventional systems, meaning that the footprint of legacy tools can be maintained, if desired.

TABLE 2

Optical Design Prescription for the System of FIG. 1

| | RDY | THI | RMD | GLA |
|---|---|---|---|---|
| OBJ: | INFINITY | 25.000000 | | |
| 1: | INFINITY | 0.000000 | | |
| 2: | INFINITY | 0.000000 | | |
| 3: | 329.41693 | 30.000000 | | 'cafl_vuv' |
| ASP: | | | | |
| K: 0.722126 | | | | |
| A: 0.000000E+00 | B: −.225942E−11 | C: 0.167998E−15 | D: −.128550E−20 | |
| E: −.233823E−24 | F: 0.685735E−29 | G: 0.000000E+00 | H: 0.000000E+00 | |
| 4: | 502.56913 | 59.208438 | | |
| 5: | INFINITY | 347.586957 | | |
| 6: | −1183.47149 | −347.586957 | REFL | |
| ASP: | | | | |
| K: | | | | |
| A: −.127089E−08 | B: 0.812330E−14 | C: −.123118E−18 | D: 0.894383E−23 | |
| E: −.276494E−27 | F: 0.402755E−32 | G: 0.000000E+00 | H: 0.000000E+00 | |
| 7: | 279.62176 | −7.500000 | | 'cafl_'vuv' |
| 8. | 745.02111 | −5.835889 | | |
| 9. | 350.74458 | −7.500000 | | 'cafl_'vuv' |
| 10. | 1226.35940 | −8.372549 | | |
| 11. | 324.93068 | 8.372549 | REFL | |
| ASP: | | | | |
| K: 0.069031 | | | | |
| A: −551054E−09 | B: −.166403E−13 | C: −.307699E−18 | D: 0.277748E−22 | |
| E: −.680019E−26 | F: 0.506026E−30 | G: 0.000000E+00 | H: 0.000000E+00 | |
| 12: | 1226.35940 | 7.500000 | | cafl_'vuv' |
| 13: | 350.74458 | 5.835889 | | |
| 14: | 745.02111 | 7.500000 | | 'cafl_'vuv' |
| 15: | 279.62176 | 304.397688 | | |
| 16: | 490.28038 | −244.852865 | REFL | |
| ASP: | | | | |
| K: −1.803201 | | | | |
| A: −.482804E−08 | B: −.125400E−12 | C: 0.242638E−17 | D: −.680221E−22 | |
| E: 0.237919E−26 | F: −.315262E−31 | G: 0.000000E+00 | H: 0.000000E+00 | |
| 17: | 667.70113 | 565.726496 | REFL | |
| ASP: | | | | |
| K: −0.118347 | | | | |
| A: −.275181E−09 | B: −.327224E−14 | C: 0.200875E−19 | D: −.620470E−24 | |
| E: 0.627048E−29 | F: −.394543E−34 | G: 0.000000E+00 | H: 0.000000E+00 | |
| 18: | INFINITY | 25.997938 | | |

TABLE 2-continued

Optical Design Prescription for the System of FIG. 1

| RDY | THI | RMD | GLA |
|---|---|---|---|
| SLB: "Intermediate image" | | | |
| 19: | −1126.18103 | −178.682300 | REFL |
| ASP: | | | |
| K: 7.738777 | | | |
| A: −.668802E−08 | B: 0.253685E−12 | C: −.548789E−17 | D: 0.625386E−22 |
| E: −.276305E−27 | F: −120188E−33 | G: 0.000000E+00 | H: −0.000000E+00 |
| 20: | −1002.36339 | 178.682300 REFL | |
| ASP: | | | |
| K: 50.616566 | | | |
| A: −973184E−08 | B: 0.308396E−12 | C: −.511443E−16 | D: 0.428520E−20 |
| E: −217208E−24 | F: 0.518418E−29 | G: 0.000000E+00 | H: 0.000000E+00 |
| 21: | INFINITY | −324.644282 | |
| 22: | INFINITY | 324.644282 | |
| SLB: "Virtual image" | | | |
| 23: | INFINITY | 139.926509 | |
| 24: | 532.50558 | 30.000000 | 'cafl_vuv' |
| ASP: | | | |
| K: −28.969955 | | | |
| A: 0.000000E+00 | B: −.109172E−I1 | C: 0.625819E−16 | D: −.274325E−20 |
| E: 0.634878E−25 | F: 0.581549E−29 | G: 0.000000E+00 | H: 0.000000E+00 |
| 25: | −584.92060 | 2.500000 | |
| 26: | 1292.88867 | 13.668481 | 'cafl_'vuv' |
| 27: | −1383.77341 | 2.500000 | |
| 28: | 760.97648 | 15.674455 | 'cafl_'vuv' |
| 29: | −1077.75076 | 11.001421 | |
| 30: | −250.22566 | 10.000000 | 'cafl_vuv' |
| 31: | −500.99843 | 11.138638 | |
| STO: | INFINITY | 22.619203 | |
| SLB: "stop" | | | |
| 33: | −298.09900 | 18.822972 | 'cafl vuv' |
| ASP: | | | |
| K: 6.689541 | | | |
| A: 0.000000E+00 | B: 0.346206E−12 | C: −498302E−17 | D: 0.272385E−20 |
| E−.106617E−24 | F: 0.175645E−28 | G: 0.000000E+00 | H: 0.000000E+00 |
| 34: | −1073.42340 | 0.500000 | |
| 35: | 267.47103 | 50.000000 | 'cafl_' vuv' |
| 36: | −607.58973 | 0.592125 | |
| 37: | 258.S1S26 | 27.182889 | 'cafl_'vuv' |
| 38: | −8945.70709 | 0.500000 | |
| 39: | 159.70628 | 39.768717 | 'cafl_'vuv' |
| ASP: | | | |
| K: −1.214880 | | | |
| A: 0.000000E+00 | B: −.252828E−11 | C: −.632030E−16 | D: −.765024E−21 |
| E: 0.477017E−24 | F: −.163970E−28 | G: 0.000000E+00 | H: 0.000000E+00 |
| 40: | −746.03878 | 0.500000 | |
| 41: | 122.36092 | 43.154424 | "cafl_'vuv' |
| 42: | 95.77143 | 4.340799 | |
| ASP: | | | |
| K: 1.012065 | | | |
| A: 000000E+00 | B: 0.214891E−12 | C: −.187071E−14 | D: −.681922E−18 |
| E: 0.313376E−22 | F: O.000000E+00 | G: 0.000000E+00 | H: 0.000000E+00 |
| 43: | 115.81595 | 30.082531 | "cafl_'vuv' |
| 44: | −1828.47137 | 9.930603 | |
| IMG: | INFINITY | 0.000000 | |

The catadioptric projection system according to a second preferred embodiment herein is schematically shown at FIG. 2 and includes two distinct optical groups G1' and G2'. Group G1' is a catadioptric group including mirrors M1'–M6' and lenses E1'–E3', as shown in FIG. 2. An object or mask plane Ob' is disposed to the left of group G1' in FIG. 2 or optically before Group G1'. Group G2' is disposed optically after group G1' and to the right of G1' in FIG. 2. An image or wafer plane Im' is disposed optically after group G2' and to the right of group G2' in FIG. 2.

Group G1' functions by correcting field aberrations and providing a conjugate stop CS' position for correction of axial chromatic aberration. Group G2' is a dioptric group including lens elements E4'–E13', as also shown in FIG. 2. Group G2' lies aft of G1', or optically nearer the image plane Im' of the system, enabling the system to achieve numerical apertures in excess of 0.65, 0.70 and even 0.75. This catadioptric system achieves a high numerical aperture preferably using no beamsplitters nor fold mirrors. The description herein examines the performance of the second preferred embodiment of FIG. 2.

The first embodiment of FIG. 1 features independent correction of lateral chromatic aberration in the individual imaging groups. This feature influenced the optical construction in terms of stop position(s), element powers and element shapes. In the present second embodiment, the independent lateral color correction feature is not included and a balance of lateral color is struck between the fore and aft groups.

Group G1' is a catadioptric group that functions by correcting field aberrations and providing a conjugate stop position to correct axial chromatic aberration. Group G2' is a dioptric group that lies aft of G1' enabling the system to achieve numerical apertures(NA) in excess of 0.65, and preferably at least 0.70, or 0.75, or even 0.80 or higher. For example, a system in accord with the preferred embodiment may be configured to exhibit a NA of 0.79 while advantageously having a RMS wavefront error of only 0.0115λ. That is, the system may be configured with a NA above 0.75, while maintaining the RMS wavefront error below 0.02λ, and even below 0.015λ.

The system shown in FIG. 2 has two distinct groups, as mentioned above. Group G1' includes an even number of at least four mirrors, and preferably has six mirrors M1'–M6'. Group G1' further preferably includes three lens elements E1'–E3'. Group G2' includes a lens barrel of ten individual lens elements E4'–E13', as shown in FIG. 2. The design is coaxial having a single common centerline, respectively, of the system of two optical groups G1' and G2' shown in FIG. 2. The design uses an off-axis field to achieve ray clearances in group G1' Since Group G2' is dioptric, ray clearance problems are eliminated enabling a system with a high numerical aperture. The concept also provides for unlimited scanning of the mask and wafer in a parallel configuration.

Group G1' of FIG. 2 forms a minified, virtual image VI' located behind mirror M6' at a reduction of ~0.8×. Group G2' relays this virtual image VI' to form a usable real image Im at the wafer. Group G2' operates at a reduction of about 0.25×. allowing the system to achieve a reduction of 0.20×. A complete optical prescription is found in Table 5 below, describing the optical surfaces in Code V format.

To correct chromatic aberration, the aperture stop AS' that lies in group G2' has a conjugate stop CS' position in group G1' between mirror M1' and M2'. This allows a negative chief ray height at elements E2' and E3' (for positive field height at the reticle (Ob')). This chief ray height, when combined with the sign of the marginal ray and the negative power of the E2'/E3' pair, provides for a lateral chromatic aberration contribution that substantially cancels the lateral color contribution from group G2'. Assuming a spectral bandwidth of 0.5 pm, this specific embodiment has a paraxial lateral color contribution from E2'/E3' of ~35 ppm, whereas the paraxial lateral color contribution from Group G2' is ~35 ppm, resulting in an advantageous sum total of approximately 0 ppm. The principle result is that the power distribution and shapes of the lenses in group G2' take on a very advantageous form.

FIG. 2 also specifically shows raytrace layout of the preferred embodiment. The system shown includes six mirrors M1'–M6' and thirteen lens elements E1'–E3' in a coaxial configuration. The design utilizes an off-axis field (ring field, rectangular slit field or the like) to enable ray clearance and allow the mask and wafer planes Ob', Im' to be parallel. Element E1 is preferably used advantageously to make the chief ray telecentric at the mask plane Ob', as described in more detail below. Group G1' forms a virtual image VI' behind mirror M6', which is relayed by dioptric group G2' to form the final image at the wafer plane Im'. A real intermediate image Im' is also formed between mirrors M4' and M5' of group G1', as shown in FIG. 2.

At mirror M2', negative lenses E2'/E3' are used in a double-pass configuration to induce overcorrected (positive) axial chromatic aberration used to correct undercorrected (negative) axial chromatic aberration created by the strong positive optical power of group G2'. The monochromatic aberrations are corrected via a balance between groups G1' and G2'. In addition, this is done in such a manner as to leave the lens elements E4'–E13' in group G2' "unstressed" as in the first embodiment.

Lens element E1' provides for the telecentric condition at the plane Ob' of the mask. It is advantageous to have positive optical power near the mask to reduce the chief ray height on mirror M1'. Lens element E1' appears to lie in conflict with the substrate of mirror M2'. To achieve this concept, it is preferred that only a small off-axis section of E1' be used. This means that pieces of a complete E1' could be sectioned to yield pieces for multiple projection systems, further reducing the required blank mass of a single system.

Another option to resolve the apparent conflict between lens E1' and the substrate of mirror M2' is to place lens E1' between mirrors M1' and M2', such as somewhere close to the group of lens elements E2'/E3'. In this Manner, the complete lens would be used.

TABLE 3

Performance Summary of System of FIG. 2

| Parameter | Performance |
|---|---|
| Wavelength (nm) | 157 |
| Spectral band (pm) | 0.5 |
| Reduction Ratio (R) | 0.20 |
| Field size (mm) | 22 × 7 |
| Numerical aperture(NA) | 0.75 |
| RMS wavefront error(waves) | 0.006 λ |
| Distortion (nm) | <2 nm |
| PAC (ppm) | 42.0 ppm |
| PLC (ppm) | 0.7 ppm |
| Total track (mm) | 1064 |
| Front working distance(mm) | 28.0 |
| Back working distance(mm) | 8.7 |
| Blank mass (kg, estimated) | 34.4 |

Table 3 summarizes design performance of the system of the preferred embodiment. The system has a composite RMS wavefront error of 0.006λ, with NA=0.75, evaluated monochromatically over the field. The distortion is less than 2 nm at all field points, and the lateral color PLC is corrected to better than 1 nm. The axial color PAC is also small and could be reduced further if desired and as understood by those spilled in the art. This design approaches an advantageous "zero aberration" condition.

TABLE 4

Composite RMS wavefront error vs. NA

| NA | RMS wavefront error |
|---|---|
| 0.75 | 0.0058 λ |
| 0.76 | 0.0061 λ |
| 0.77 | 0.0064 λ |
| 0.78 | 0.0075 λ |
| 0.79 | 0.0115 λ |
| 0.80 | 0.0207 λ |
| 0.81 | 0.0383 λ |
| 0.82 | 0.0680 λ |

As desired dimensional specifications of IC manufactures shrink, the numerical aperture may be advantageously scaled in accord with the preferred embodiment. Table 3 illustrates how the design of FIG. 1 may be scaled as the numerical aperture is increased. A local minimum that does not scale well with aperture is preferably avoided, since otherwise to achieve increased numerical aperture would involve additional redesign. The aperture scaling of the preferred embodiment illustrated at FIG. 1 is presented in Table 3, above. From a qualitative standpoint, the table reveals that the preferred embodiment herein scales well with numerical aperture. For example, the composite RMS only grows by 0.005λ from 0.0058λ to 0.0115λ as the NA is scaled from 0.75 to 0.79. The results indicate that the system of the preferred embodiment my be scaled to a numerical aperture larger than 0.80.

TABLE 5

Optical Design Prescription of System of FIG. 2

| RDY | THI | RMD | GLA |
|---|---|---|---|
| OBJ: | INFINITY | 28.000000 | |
| 1: | INFINITY | 0.000000 | |
| 2: | INFINITY | 0.000000 | |
| 3: | 256.21415 | 19.957583 | 'cafl_vuv' |
| 4: | 461.83199 | 42.954933 | |
| 5: | INFINITY | 329.408468 | |
| 6: | −947.39721 | −329.408468 | REFL |
| ASP: | | | |
| K: 10.217685 | | | |
| A: −.271423E−08 | B: 0.413774E−13 | C: 0.119957E−17 | D: 0.566939E−22 |
| E: −.201485E−26 | | | |
| 7: | 235.67059 | −5.250000 | 'cafl_vuv' |
| 8: | 1202.79595 | −18.801014 | |
| 9: | 199.92931 | −5.250000 | 'cafl vuv' |
| 10: | 471.74620 | −10.153919 | |
| 11: | 245.63551 | 10.153919 | REFL |
| ASP: | | | |
| K: 0.060091 | | | |
| A: 0.624853E−09 | B: 0.113020E−13 | C: −.515404E−18 | D: O.I70604E−21 |
| E = .159226E−25 | F: 0.105279E−29 | | |
| 12: | 471.74620 | 5.250000 | 'cafl_vuv' |
| 13: | 199.92931 | 18.801014 | |
| 14: | 1202.79595 | 5250000 | 'cafl_vuv' |
| 15: | 235.67059 | 298.515259 | |
| 16: | 490.36196 | −227.868676 | REFL |
| ASP: | | | |
| K: 0.133019 | | | |
| A: −.401120E−OS | B: −.925737E−13 | C: −.236166E−17 | D: 0.108790E−21 |
| E: −.551175E−26 | F: 0.127289E−30 | | |
| 17: | 6I1.66355 | 331.489215 | REFL |
| ASP: | | | |
| K: −0.837736 | | | |
| A: 0.918739E−11 | B: −.476080E−14 | C: 0.346155E−19 | D: −.225369E−23 |
| E: 0.307373E−28 | F: −.248704E−33 | | |
| 18: | INFINITY | 126.863525 | |
| 19: | −561.20466 | −126.090855 | REFL |
| ASP: | | | |
| K: 2.976905 | | | |
| A: −.I54058E−09 | B: 0.125754E−13 | C: 0.647835E−19 | D: 0.684380E−23 |
| E: −.112193E−27 | F: 0.122096E−32 | | |
| 20: | 278.57130 | 126.090855 | REFL |
| ASP: | | | |
| K: 8.694109 | | | |
| A: −.272648E−07 | B: 0.129115E−12 | C: −.101751E−15 | D: 0.402887E−19 |
| E: −.610026E−23 | F: 0.531569E−27 | | |
| 21: | INFINITY | −226.338582 | |
| 22: | INFINITY | 226.338582 | |
| 23: | INFINITY | 52.284606 | |
| 24: | 729.88242 | 21.000000 | 'cafl_vuv' |
| ASP: | | | |
| K: −31.964685 | | | |
| A: O:000O00E+00 | B: 0.562441E−11 | C: 0.152848E−16 | D: −.915976E−20 |
| E: 0.259148E−24 | F: 0.238241E−28 | | |
| 25: | 158.15364 | 17.296741 | |
| 26: | 1355.83270 | 24.560562 | 'cafl_vuv' |
| 27: | −210.48464 | 0.700000 | |
| 28: | 376.45149 | 23.959662 | 'cafl_vuv' |
| 29: | −356.27423 | 15.713419 | |
| 30: | −132.60708 | 38.500000 | 'cafl_vuv' |
| 31: | −152.06343 | 0.700000 | |
| STO: | INFINITI' | 12.628192 | |
| 33: | 273.21370 | 38.500000 | 'cafl_vuv' |
| ASP: | | | |
| K: 5.588882 | | | |
| A: O:000O00E+00 | B: 0.113851E−11 | C: 0.272852E−16 | D: 0.288236E−20 |
| E: 0.101289E−24 | F: 0.171576E−25 | | |
| 34: | −276.08617 | 0.700000 | |
| 35: | 240.81764 | 38.500000 | 'cafl_vuv' |
| 36: | −48844.10806 | 11.186318 | |

TABLE 5-continued

Optical Design Prescription of System of FIG. 2

| | | | |
|---|---|---|---|
| 37: | 164.33601 | 38.500000 | 'cafl vuv' |
| 38: | −2168.86405 | 2.528995 | |
| 39: | 157.43497 | 38.500000 | 'cafl vuv' |
| ASP: | | | |
| K: −1.250301 | | | |
| A: 0:000O00E+00 | B: −.532791E−11 | C: −.258778E−15 | D: −.139880E−19 |
| E: 0.252524E−23 | F::138502E−28 | | |
| 40: | 29770.37524 | 2.727081 | |
| 41: | 130.31599 | 33.479292 | 'cafl_vuv' |
| 42: | 54.66735 | 3.097821 | |
| ASP: | | | |
| K: 0.179565 | | | |
| A: 0:000O00E+00 | B: 0.129145E−I 1 | C: −.283430E−14 | D: .650118E−17 |
| E: 0.238362E−20 | | | |
| 43: | 108.48722 | 20.284450 | 'cafl_vuv' |
| 44: | INFINITY | 8.741020 | |
| IMG | INFINI11' | 0.000000 | q |

SPECIFICATION DATA
NAO 0.15000
TEL
DIM          MM
WL           157.63           157.63           157.63
REF 21 1
WTW          1                1                1

| | | | | | |
|---|---|---|---|---|---|
| XOB | 0.00000 | 0.00000 | 0.00000 | 0.00000 | 0.00000 |
| YOB | 66.50000 | 75.25000 | 84.00000 | 92.75000 | 101.50000 |
| YOB | 1.00000 | 1.00000 | 1.00000 | 1.00000 . | 1.00000 |
| VUY | 0.00000 | 0.00000 | 0.00000 | 0.00000 | 0.00000 |
| VLY | 0.00000 | 0.00000 | 0.00000 | 0.00000 | 0.00000 |

REFRACTNE INDICES
GLASS CODE      157.63
'cafl_vuv'      1.559288
No solves defined in system
INFINITE CONJUGATES
EFL −21643.8522
BFL −4320.0292
FFL 0.1082E+06
FNO 0.0000
AT USED CONJUGATES
RED −0.2000
FNO −0.6667
OBJ DIS 28.0000
TT 1064.0000
IMG DIS 8.7410
OAL 1027.2590
PARAXIAL IMAGE
HT 20.3000
THI 8.7412
ANG 0.0000
ENTRANCE PUPIL
DIA 0.3034E+10
THI 0.1000E+11
EXIT PUPIL
DIA 6567.5310
TFil −4320.0760
SPECIFICATION DATA
NAO 0.15000
TEL
DIM MM
WL 157.63
REF 1
WTW 1

| | | | | | |
|---|---|---|---|---|---|
| XOB | 0.00000 | 0.00000 | 0.00000 | 0.00000 | 0.00000 |
| | 0.00000 | 0.00000 | 0.00000 | 0.00000 | |
| YOB | 100.00000 | 107.50000 | 115.00000 | 125.50000 | 130.00000 |
| | 105.00000 | 110.00000 | 120.00000 | 125.00000 | |
| YOB | 1.00000 | 1.00000 | 1.00000 | 1.00000 . | 1.00000 |
| | 1.00000 | 1.00000 | 1.00000 | 1.00000 . | |
| VUY | 0.00000 | 0.00000 | 0.00000 | 0.00000 | 0.00000 |
| | 0.00000 | 0.00000 | 0.00000 | 0.00000 | |
| VLY | 0.00000 | 0.00000 | 0.00000 | 0.00000 | 0.00000 |
| | 0.00000 | 0.00000 | 0.00000 | 0.00000 | |

REFRACTNE INDICES
GLASS CODE      157.63
'cafl vuv'      1.559288
No solves defined in system

TABLE 5-continued

Optical Design Prescription of System of FIG. 2

INFINITE CONJUGATES
EFL -521.5384
BFL -94.3531
FFL 2582.5092
FNO 0.0000
AT USED CONJUGATES
RED -0.2000
FNO -0.6667
OBJ DI5 25.0000
TT 1249.8815
IMG DIS 9.9306
OAL 1214.9509
P. SRAXIAL IMAGE
HT 25.0018
THI 9.9619
ANG 0.0000
ENTRANCE PUPIL
DIA 0.3034E+10
THI 0.1000E+11
EXTf PUPIL
DIA 155.2520
THI -94.3531

The optical design description provided herein demonstrates an advantageous catadioptric projection system for DUV or VUV photolithography. While the preferred embodiment has been designed for use in an 157 nm tool, the basic concept has no wavelength limitations, either shorter or longer, providing a suitable refractive material exists. Some features of the preferred system herein are summarized below.

Configuration

The preferred optical system is catadioptric and includes two optical groups, group G1 and group G2, configured such that group G1 presents a reduced, virtual image to group G2. The function of group G2 is to relay this virtual image to a real image located at the plane of the wafer. Group G1 preferably includes an even number of at least four and preferably 4 or 6 mirrors in combination with lens elements whose primary function is to provide telecentricity at the mask and enable correction of axial chromatic aberration. In the preferred embodiment, an image of the aperture stop is located in close proximity to mirror M2.

Group G2 is preferably entirely dioptric providing most of the system reduction and a corresponding high numerical aperture (in excess of 0.65, 0.70 and even 0.75) at the image. This group G2 also makes the final image telecentric in image space. Group G1 functions to correct high-order field aberrations, advantageously allowing a substantial relaxation of the lens elements found in group G2. Both group G1 and group G2 make use of aspheric surfaces as set forth in the Table 2. The same holds for the second preferred embodiment.

Symmetry

The preferred optical design herein is co-axial, wherein each of the optical elements is rotationally symmetric about a common centerline. The preferred system advantageously does not utilize fold mirrors, prisms or beamsplitters to fold the opto-mechanical axis. This enables a compact configuration and eliminates substantial bulk refractive material that may be difficult to procure in a timely manner.

Parallel Scanning

The preferred optical system herein achieves mask and wafer planes that are parallel, enabling unlimited scanning in a step/scan lithographic configuration.

Correction of Chromatic Aberration

Correction of chromatic aberration is achieved preferably using a single optical material in the catadioptric configuration described herein. Lateral chromatic aberration is at least substantially self-corrected within group G2, using a balance of optical power on either side of a primary aperture stop located within group G2. Correction of axial chromatic aberration is enabled using a negative lens group E2/E3 located at mirror M2 in group G1, providing an axial chromatic aberration contribution that is nearly equal in magnitude and opposite in sign to the chromatic aberration generated by G2. This high level of axial chromatic aberration correction relaxes the need for a high spectral purity laser exposure source with linewidths on the order of 0.1 to 0.2 pm.

Some additional features of the preferred system herein are set forth below. The preferred system is an imaging system for photolithographic applications using 157 nm, 193 nm or 248 nm or other exposure radiation including first and second optical groups, or groups G1 and G2. The first optical group, i.e., group G1, is either a catoptric or catadioptric group including preferably six mirrors. Group G1 preferably also includes one or more lens elements, e.g., to make the chief ray telecentric at a mask plane and to correct axial chromatic aberration.

The second optical group, or Group G2, is a dioptric group of several lens elements for reducing and projecting an image to a wafer plane. Group G2 is preferably a relaxed group such that optical paths of projected rays are smoothly redirected at each lens element, e.g., less than 45° and preferably less than 30°, and still more preferably less than 20°, as shown in FIG. 1. This preferred system is contradistinct form a Dyson-type system which has one reflective component performing reduction of the image. In contrast to the Dyson-type system, the preferred system has a dioptric second group (group G2) performing reduction, while the catoptric or catadioptric first group (group G1) forms a virtual image for reduction by Group G2 and provides aberration compensation for group G2.

The first and second groups, or groups G1 and G2, respectively, of the preferred imaging system herein enable parallel scanning and a symmetric, coaxial optical design. Stops are located preferably at or near the second mirror M2 of Group G1 and within Group G2. The first stop may be alternatively moved off of the second mirror to enhance aberration correction.

Group G2 is preferably independently corrected for lateral color, while the refractive components of the first group compensate those of the second group far longitudinal color. Advantageously, 15 or fewer total lens elements are preferably included in the system, group G2 preferably having 10 or fewer lens elements. For example, the system of FIG. 1 shows ten lens elements E4–E13 in group G2 and three additional lens elements in group G1.

The sixth or final mirror in group G1 may be preferably a convex mirror and preferably a virtual image is formed behind the sixth mirror. Group G2 forms a real image at the wafer plane.

When used with 157 nm exposure radiation, all of the refractive elements of the imaging system. e.g., lens elements E1–E13 of the preferred system of FIG. 1, are preferably made from a VUV transparent material such as CaF2. Alternatively, such materials as BaF2, SrF2, MgF2 or LiF may be used.

While exemplary drawings and specific embodiments of the present invention have been described and illustrated, it is to be understood that the scope of the present invention is not to be limited to the particular embodiments discussed. Thus, the embodiments shall be regarded as illustrative rather than restrictive, and it should be understood that variations may be made in those embodiments by workers skilled in the arts without departing form the scope of the present invention as set forth in the claims that follow, and equivalents thereof. In addition, the features of different claims set forth below may be combined in various ways in further accordance with the present invention.

What is claimed is:

1. A photolithographic reduction projection catadioptric objective with a beam path, comprising: a first optical group including an even number of at least six mirrors; and a second at least substantially dioptric optical group more imageward than said first optical group including a number of lenses, and wherein said first optical group provides compensative axial colour correction for said second optical group, wherein a virtual image is formed by the first optical group physically on the object side of a sixth mirror and optically further along the optical beam path after said sixth mirror.

2. The objective of claim 1, wherein said image is formed with a numerical aperture of at least substantially 0.65.

3. The objective of claim 1, wherein said at least four mirrors of said first optical group include a convex mirror arranged most imageward in the beam path of the objective, and wherein said second optical group receives a beam from said convex mirror.

4. The objective of claim 1, wherein optical surfaces of each minor of said objective are at least sections of surfaces of revolution each having a common axis of symmetry.

5. The objective of claim 1, wherein said second optical group is configured for independent compensative lateral aberrative correction.

6. The objective of claim 1, wherein said image is formed with a numerical aperture of at least substantially 0.70.

7. The objective of claim 6, wherein said second optical group is configured for independent compensative lateral color correction.

8. The objective of claim 1, wherein said image is formed with a numerical aperture of at least substantially 0.75.

9. A photolithographic reduction projection catadioptric objective, comprising: a first optical group including an even number of at least six mirrors for producing a virtual intermediate image; and a second at least substantially dioptric optical group more imageward than said first optical group, said second optical group including a number of lenses for receiving the virtual image and providing image reduction, and wherein said first optical group provides compensative axial colour correction for said second optical group, wherein a virtual image is formed by the first optical group physically on the object side of a sixth mirror and optically further along the optical beam path after said sixth mirror.

10. The objective of claim 9, wherein said second optical group is configured for independent compensative lateral colour correction.

11. A photolitho graphic reduction projection catadioptric objective, comprising: a first optical group including an even number of at least six mirrors including a convex most imageward mirror, and a second at least substantially dioptric optical group more imageward than said first optical group receiving a beam from the convex most imageward mirror of the first optical group, said second optical group including a number of lenses providing image reduction, and wherein said first optical group provides compensative axial colour correction for said second optical group, wherein an intermediate image is formed optically between a fourth mirror and a fifth mirror and a virtual image is formed optically further along the optical beam path after the first optical group.

12. The objective of claim 11, wherein said image is formed with a numerical aperture of at least substantially 0.65.

13. The objective of claim 11, wherein said at least six mirrors of said first optical group include a convex most imageward mirror, and wherein said second optical group receives a beam from said convex most imageward mirror.

14. The objective of claim 11, wherein optical surfaces of each mirror of said objective are at least sections of surfaces of revolution each having a common axis of symmetry.

15. The objective of claim 14, wherein said unobscured aperture is located within said second optical group.

16. The objective of claim 11, wherein said second optical group is configured for independent compensative lateral colour correction.

17. The objective of claim 11, further comprising an unobscured system aperture.

18. The objective of claim 11, further being devoid of any planar folding mirrors.

19. The objective of claim 11, wherein an optical beam incident at said first optical group is divergent after a most imageward mirror of said first optical group.

20. The objective of claim 11, which is further an unobscured system comprising parallel axes of symmetry of curvatures of each optical element of said first and second optical groups, and wherein no more than three of said optical elements are cut to deviate in a substantially non-rotationally symmetric form.

21. The objective of claim 11, comprising in sequence, in an optical direction form an object side of said objective before said first optical group to an image side of said objective after said second optical group, a first catadioptric sub group for producing a real intermediate image, a second sub group including catoptric components for producing a virtual image, and said second at least substantially dioptric group for producing a real image.

22. The objective of claim 11, comprising in sequence, in an optical direction from an object side of said objective before said first optical group to an image side of said objective after said second optical group, a first field lens sub group, a second catadioptric sub group comprising one or more negative lenses and a concave mirror, generating axial chromatic aberration, a third sub group including an odd number of catoptric components, and a fourth positive lens group.

23. The objective of claim 11, wherein said second optical group comprises a plurality of lenses, wherein a diameter of a beam incident upon each of said plurality of lenses is at least half of a diameter of said each lens.

24. The objective of claim 11, wherein said objective is doubly telecentric.

25. The objective of claim 11, wherein optical paths of projected rays are redirected at each lens element of said second optical group at an angle of less than substantially 20°.

26. The objective of claim 11, wherein said image is formed with a numerical aperture of at least substantially 0.70.

27. The objective of claims 11, wherein said image is formed with a numerical aperture of at least substantially 0.75.

28. A photolithographic reduction projection catadioptric objective, comprising: a first optical group including an even number of at least six mirrors; and a second at least substantially dioptric optical group more imageward than said first optical group including a number of lenses for providing image reduction and having a lens being arranged immediately adjacent to the first optical group, wherein a third mirror of the first optical group and a fourth mirror of the first optical group are disposed optically after a first mirror of the first optical group and a second mirror of the first optical group but are physically disposed between the first mirror and the second mirror.

29. A photolithographic reduction projection catadioptric objective, comprising: a first optical group including an even number of at least six mirrors; and a second at least substantially dioptric optical group more imageward than said first optical group including a number of lenses for providing image reduction, wherein a third mirror and a fourth mirror are disposed optically after a first mirror and a second mirror but are physically disposed between the first mirror and the second mirror, wherein at least one lens is arranged in the optical path between the first mirror and a last mirror of the first optical group.

* * * * *